United States Patent [19]

Kawana

[11] Patent Number: 6,014,533
[45] Date of Patent: Jan. 11, 2000

[54] CONNECTOR, PROCESSING UNIT OR PROCESS CARTRIDGE, AND ELECTROPHOTOGRAPHIC IMAGE FORMING APPARATUS

[75] Inventor: Takashi Kawana, Yokohama, Japan

[73] Assignee: Canon Kabushiki Kaisha, Tokyo, Japan

[21] Appl. No.: 09/076,236

[22] Filed: May 12, 1998

[30] Foreign Application Priority Data

May 12, 1997 [JP] Japan .................................. 9-137827

[51] Int. Cl.[7] .......................... G03G 15/00; G03G 21/16
[52] U.S. Cl. .............................. 399/90; 399/25; 399/111; 439/69
[58] Field of Search ...................... 439/70, 68, 526, 439/638, 69; 399/24, 25, 26, 90, 111

[56] References Cited

U.S. PATENT DOCUMENTS 4,702,706 10/1987 Sadigh-Behzadi ........................ 439/69
4,961,088 10/1990 Gilliland et al. ........................ 355/206

*Primary Examiner*—Richard Moses
*Attorney, Agent, or Firm*—Fitzpatrick, Cella, Harper & Scinto

[57] ABSTRACT

A couple of electrical connectors for electrical connection includes first and second connectors. The first connector has first electrical contacts and has a memory. The second connector has second electrical contacts adjacent one end for electrical connection with the first connector. The second connector also has third electrical contacts adjacent another end for connection with a cable connector, for transmission of a signal of the memory. The interval of the second electrical contacts are different from that of the third electrical contacts. The interval of the third electrical contacts is smaller than that of the first electrical contacts. This structure facilitates the downsizing of the cable connector.

24 Claims, 17 Drawing Sheets

CONNECTOR, PROCESSING UNIT OR PROCESS CARTRIDGE, AND ELECTROPHOTOGRAPHIC IMAGE FORMING APPARATUS

FIELD OF THE INVENTION AND RELATED ART

The present invention relates to an electrical connector, a process cartridge, and an electrophotographic image forming apparatus.

In this specification, an electrophotographic image forming apparatus includes an electrophotographic copy machine, an electrophotographic printer (LED printer, laser beam printer, and the like), an electrophotographic facsimile apparatus, an electrophotographic word processor, and the like. Also in this specification, the term process cartridge means a process cartridge that is removably installable in the main assembly of an electrophotographic image forming apparatus, and integrally comprises an electrophotographic photosensitive member, as well as a charging means, a developing means, and/or a cleaning means. It also refers to a process cartridge that is removably installable in the main assembly of an image forming apparatus, and integrally comprises an electrophotographic photosensitive member, and at least a developing means.

Further, the present invention relates to any unit removably installable in the main assembly of an image forming apparatus. More specifically, it relates to any unit such as a developing device, a toner cartridge, a process cartridge, or the like, which is removably installable in the main assembly of an image forming apparatus.

It is common knowledge that some image forming apparatuses, such as copy machines and laser beam printers, which employ an electrophotographic image formation process can be rendered maintenance-free with the use of a process cartridge which integrally comprises an electrophotographic photosensitive member, and one or a plurality of processing means, such as a cleaning unit or a development unit, which acts on the electrophotographic photosensitive member.

In the case of such an image forming apparatus as described above, after the functions of the structural components in a process cartridge deteriorate due to usage, the process cartridge is entirely replaced with a fresh process cartridge. This process cartridge replacement operation is an extremely simple operation comprising a step of opening the main assembly of the image forming apparatus, a step of removing the process cartridge with worn components out of the main assembly of the image forming apparatus, and a step of installing a fresh process cartridge in the main assembly of the image forming apparatus. Therefore, such an image forming apparatus can be easily maintained by a user alone.

Recently, the aforementioned conventional art has been further developed to improve the utility of the above described image forming apparatus. More specifically, it has been considered to add the following function to the above image forming apparatus.

Further, in the case of a color laser beam printer, two process cartridges, which are removably installable in the main assembly of the printer, are employed to render the printer maintenance free. One of the two process cartridge is a drum cartridge which integrally comprises an electrophotographic photosensitive member, a cleaning unit, and a waste toner container, and the other cartridge is a development cartridge which contains magenta toner, cyan toner, yellow toner, and black toner.

Recently, the aforementioned conventional art pertaining to a process cartridge has been further developed to improve the utility of the above described image forming apparatus. More specifically, it has been considered to add the following functions to the above image forming apparatus.

(1) An electronic device or the like is mounted in a process cartridge, and data regarding manufacturing conditions or the like are written into the electronic device at the time of manufacturing or shipment, and when this process cartridge is installed into the main assembly of an image forming apparatus, the data is looked up by the main apparatus side of the image forming apparatus in order to carry out an image forming operation under the optimum conditions for the process cartridge.

(2) The remaining service life of the photosensitive drum in each process cassette is detected during an image forming operation, and this data regarding the remaining service life of the photosensitive drum are retained in the memory so that the remaining service life of the photosensitive drum can be looked up any time.

(3) The diagnostic data of the main assembly side of an image forming apparatus are retained in the memory mounted on the process cartridge side, and the contents of the memory can be looked up by a service provider in the event of any anomaly or at a maintenance time, so that the apparatus can be quickly and accurately serviced.

In order to add the above functions, it is necessary to mount an electronic device, such as an EEPROM, in a unit, such as a process cartridge, which is removably installable in the main assembly of an image forming apparatus. In the case of a conventional unit, an electronic device, such as a memory, is mounted on a printed circuit board, and then, the printed circuit board on which a memory has been mounted is mounted in the unit or in the process cartridge.

When it is necessary to mount electronic components, such as a nonvolatile IC type memory, on the process cartridge side or the like cartridge side as described above, it is common practice to mount the electronic component and functional components, such diodes, resistors, condensers, and connectors, on a printed circuit board, along with the IC's, to protect the IC's from external surge pulses.

SUMMARY OF THE INVENTION

A primary object of the present invention is to provide a connector comprising a memory, a process cartridge or a like unit comprising such a connector, and an electrophotographic image forming apparatus compatible with such a processing unit or a process cartridge.

Another object of the present invention is to provide a connector which assures desirable electrical connection, a process cartridge or a like unit comprising such a connector, and an electrophotographic image forming apparatus compatible with such a process cartridge or a like unit.

Another object of the present invention is to provide a connector, the cost of which is low, a process cartridge or a like unit comprising such a connector, and an electrophotographic image forming apparatus compatible with such a process cartridge or a like unit.

Another object of the present invention is to provide a connector, the contacts of which are arranged in such a manner that the distance between the adjacent two contacts on the side to be engaged with a memory is the same as the distance between the adjacent two contacts on the side to be engaged with a connector, which is connected to a cable connector, a process cartridge or the like unit comprising such a connector, and an electrophotographic image forming apparatus compatible with such a process cartridge or a like unit.

These and other objects, features and advantages of the present invention will become more apparent upon a consideration of the following description of the preferred embodiments of the present invention taken in conjunction with the accompanying drawings.

DETAILED DESCRIPTION OF THE PREFERRED EMBODIMENTS

Embodiment 1

Figure 1:
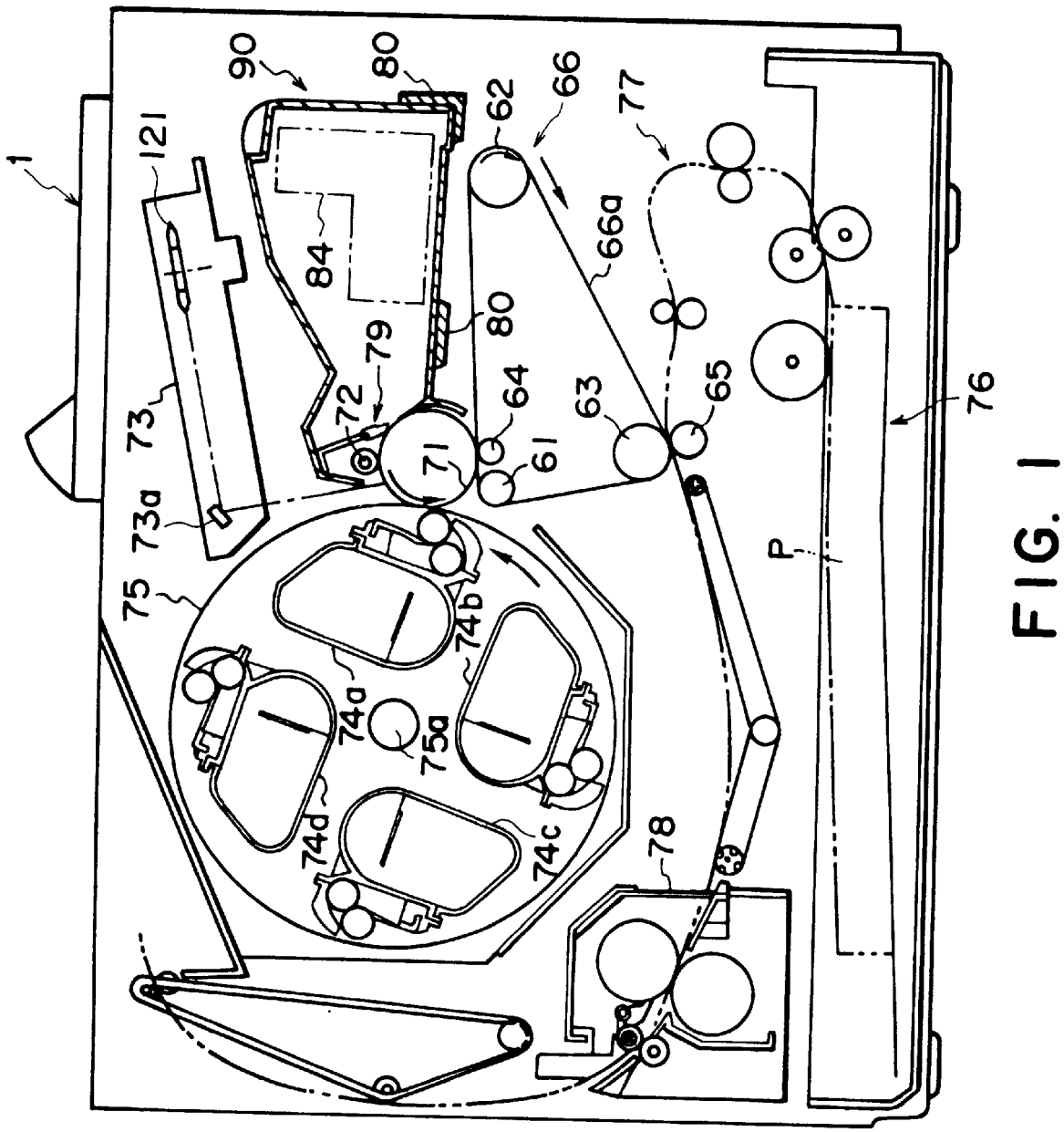
FIG. 1 is a vertical section of a laser beam printer as an image forming apparatus.

FIG. 1 is a vertical section, parallel to the lateral walls of the image forming apparatus, of a typical image forming apparatus in accordance with the present invention, and depicts the general structure of the apparatus. More specifically, the apparatus illustrated in the drawing is a color laser beam printer (hereinafter, "printer"), which has a resolution of 600 dots/inch (dpi), and records images based on digital data in which each picture element for each color component is expressed in eight bits It should be noted here that in all of the following embodiments of the present invention, the invention will be described with reference to the apparatus in FIG. 1.

The present invention is applicable to a color laser printer in which toner images of different colors individually formed on a photosensitive drum 71 are individually transferred first, onto an intermediary transfer unit 66, and then, are transferred all at once from the intermediate transfer unit 66 onto a transfer sheet P.

Referring to FIG. 1, the photosensitive drum 71 is driven by an unillustrated driving means in the direction indicated by an arrow mark, and as it is driven, it is uniformly charged to a predetermined potential level by a charge roller 72. Then, a laser beam modulated with the signals reflecting the yellow component of a target image is projected from an exposing apparatus into which the signals reflecting the yellow component of the target image are inputted. As a result, a latent image is formed on the photosensitive drum 71.

As the photosensitive drum 71 is further rotated in the direction indicated by the arrow, the latent image is visualized by a developing device 74a, which contains yellow toner, and the peripheral surface of which is placed virtually in contact with the peripheral surface of the photosensitive drum 71. More specifically, the developing device 74a is one of developing devices 74a, 74b, 74c, and 74d held in a frame 75 which is rotatably supported by an axis 75a, and can be held to selectively position any one of the developing devices at a development station so that the surface of the selected developing device is placed virtually in contact with the peripheral surface of the photosensitive drum 71. Then, the developed latent image, that is, a toner image, is transferred onto an intermediary transfer belt 66a, or an intermediary transfer member. After this intermediary transfer, the toner particles remaining on the photosensitive drum 71 are removed by a cleaning apparatus 79, and are collected in a waste toner bin 84.

The intermediary transfer belt 66a is supported by three rollers 61, 62 and 63, and as the rollers rotate, the surface of the intermediary transfer belt 66a moves in the direction indicated by an arrow. At a point where the intermediary transfer belt 66a is in contact with the photosensitive drum 71, a primary transfer roller 64 is disposed in contact with the inward side surface of the intermediary transfer belt 66a, and as a predetermined bias is applied to the intermediary transfer belt 66a from an unillustrated high voltage power source, the toner image on the photosensitive drum 71 is transferred onto the intermediary transfer belt 66a.

The above described steps are carried out for the magenta component, the cyan component, and the black component of the target image, in this order, with the use of the developing devices 74b, 74c and 74d, respectively. As a result, four color toner images are superposed on the intermediary transfer belt 66a.

These four color toner images are transferred all at once by a secondary transfer roller 65 onto a transfer sheet P delivered, in synchronism with the movement of the surface of the intermediary transfer belt 66a, from a sheet feeder 76 by a conveying means 77. Thereafter, the color toner images are fused to the transfer sheet P by a fixing apparatus 78, which applies heat and pressure, becoming a permanent color image on the transfer sheet P.

A charge roller 72, the photosensitive drum 71, and a cleaning device 79 are integrated in the form of a process cartridge 90, which is removably installable in the main assembly 13 of an image forming apparatus along the guiding means 80. Further, the four developing devices 74a–74d for different colors are also structured in the same manner as the process cartridge 90; they are structured in such a manner that they can be independently mounted in, or removed from, the frame 75 attached to the main assembly 13. These provisions make it possible for an average user to easily carry out operations for replacing or maintaining the above described members, which have been formerly carried out by professional service personnel.

Figure 2:
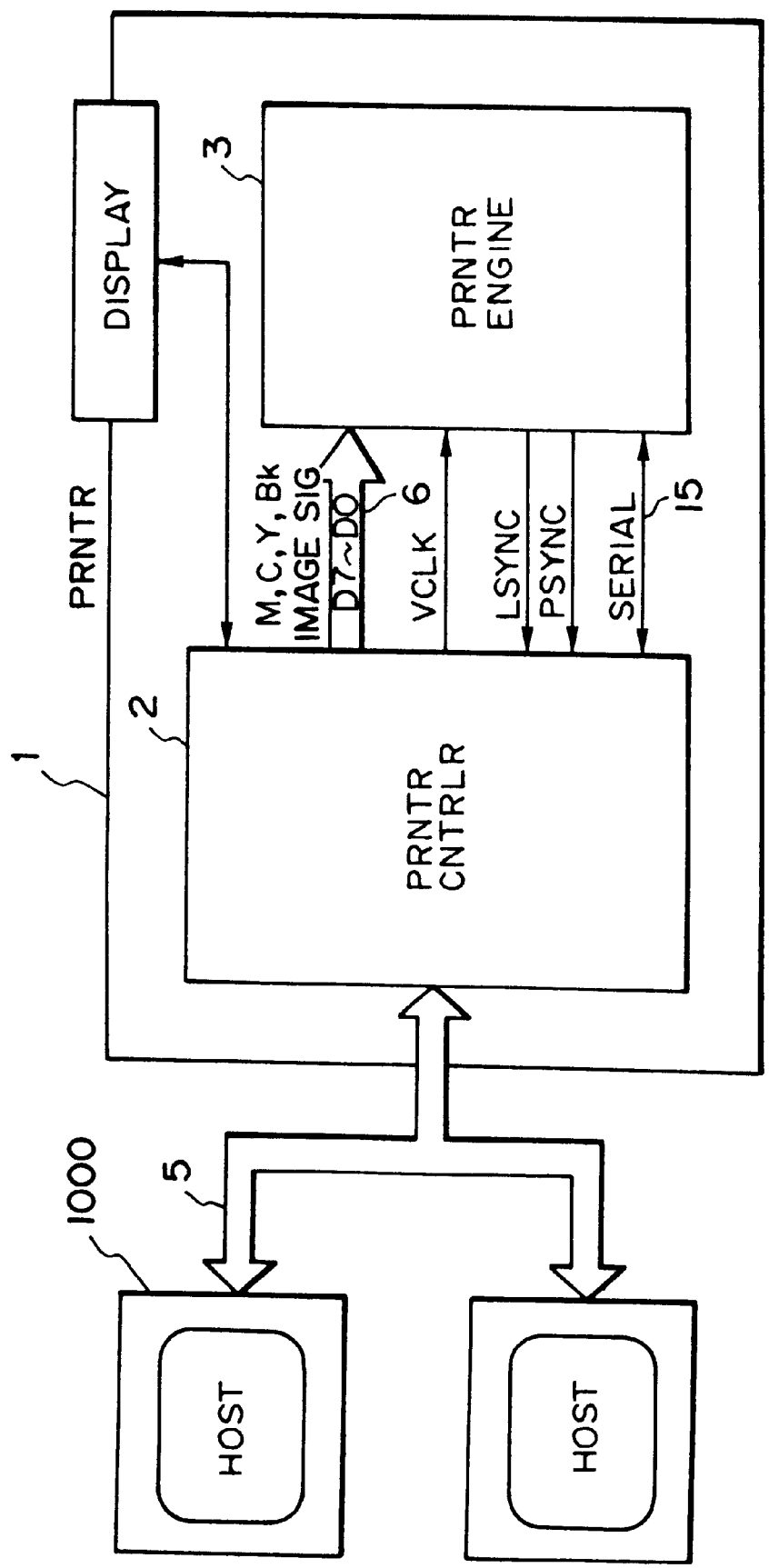
FIG. 2 is a block diagram which depicts the operation of the color beam printer illustrated in FIG. 1.
Figure 3:
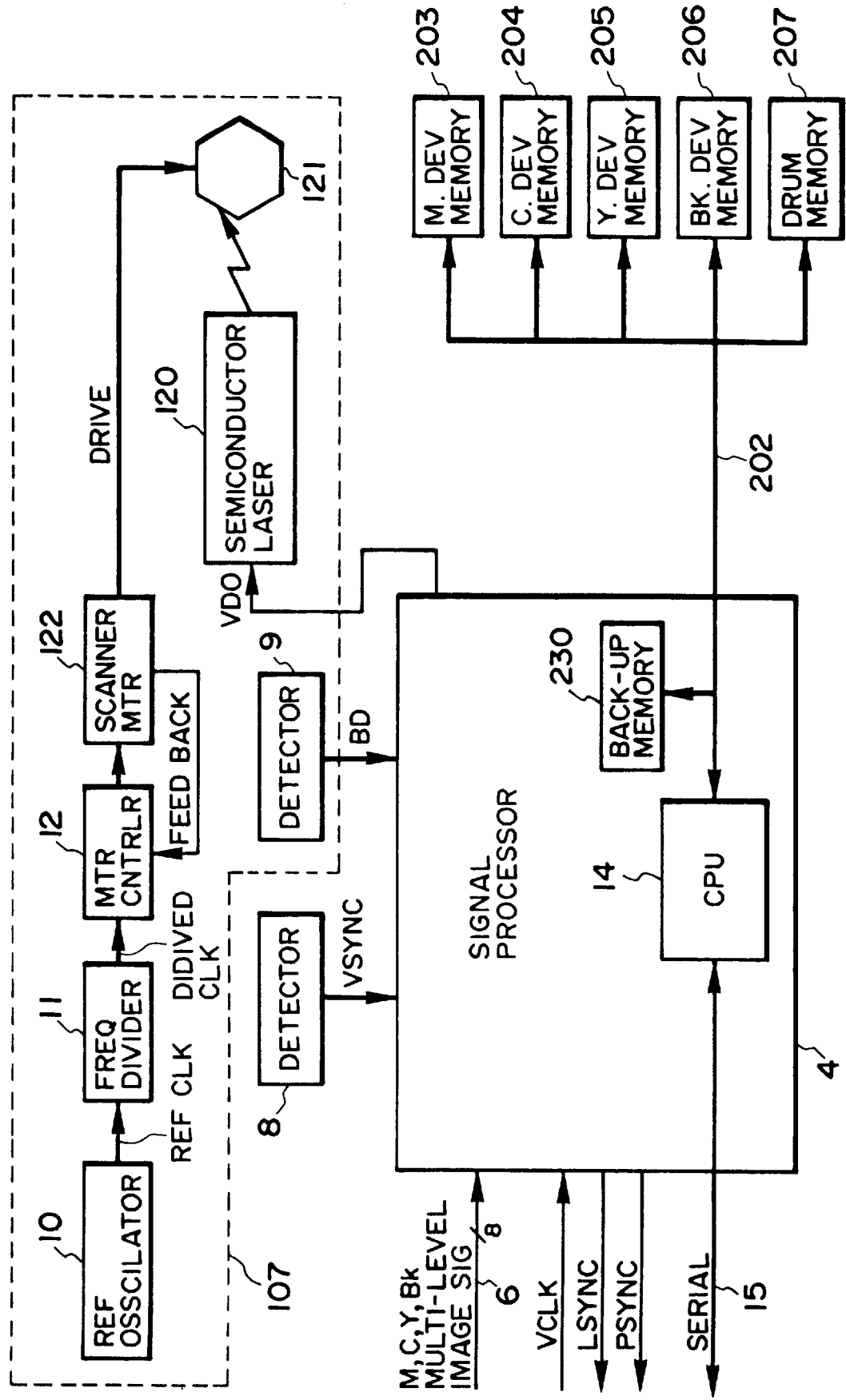
FIG. 3 is a block diagram which depicts the operation of the printer engine of the color laser beam printer illustrated in FIG. 1.

The exposing device 73 basically comprises a semiconductor laser 120, a circuit for driving the laser 120, a polygon mirror 121, a scanner motor 122, a mirror 73a for deflecting a laser beam, and a BD detection circuit (FIG. 3). As a print start command is issued from a print controller 2 (FIG. 2), the scanner motor 122 is activated. Then, as the scanner motor 122 reaches its constant rotational speed, image signals reflecting the yellow color component are transferred from a printer controller, and the semiconductor laser 120 emits a beam of light, in accordance with these image signals, toward the polygon mirror 121 which is rotating at a constant speed. The laser beam emitted from the laser 120 is deflected by the polygon mirror 121 and mirror 73a, and irradiates the peripheral surface of the photosensitive drum 71. As the laser beam is detected by a detector positioned in alignment with the main scanning axis, a BD signal, which serves as a horizontal synchronizing signal is outputted to cause the laser beams to scan the peripheral surface of the photosensitive drum 71; and the peripheral surface of the photosensitive drum 71 is exposed to the scanning laser beam. As a result, an electrostatic latent image is formed on the peripheral surface of the photosensitive drum 71.

The above described exposing process, and the developing process which follows the exposing process, are carried out for four color components to superpose (primary transfer) four color toner images on an intermediary transfer unit 66. Then, a transfer sheet P is fed, and the four color toner images on the intermediary transfer unit 66 are transferred (Secondary transfer) all at once onto the transfer sheet P.

The color laser beam printer in this embodiment outputs images at a resolution of 600 dpi through the image forming process described above.

As for the input data for this printer, the following image data are conceivable: color image data (for example, data for RGB color components) generated by a host computer (hereinafter, "host"); image data which are stored in any given recording medium after being generated by an image data generating apparatus (still image recorder or the like) other than the host computer; and the like. Therefore, this printer is provided with a printer controller 2, which receives the image information from the host 1000 and generates image data, and a signal processing section 4 (FIG. 3), which processes the image data, as depicted in FIG. 2.

In the following several embodiments, the input data for the printer, which are transmitted from the host 1000, are described as color image data.

FIG. 2 is a block diagram of the operation of the printer 1 in accordance with the present invention. In FIG. 2, the printer 1 comprises the printer controller 2 and a printer engine 3. The printer controller 2 receives image information 5 expressed in a predetermined descriptive language, from a host 1000, and develops the image information 5 into a YMCBk image signal 6 in which each color is expressed by eight bits (D0–D7). Sometimes, the host 1000 sends, as the image information 5, bit data such as RGB data read in through an Image reader or the like. In such cases, the printer controller 2 processes the bit data without interpreting them.

In addition to the image signal 6, various other image signals are exchanged in the form of serial communication between the printer controller 2 and the printer engine 3. There are page synchronization signals PSYNC (scanning in the secondary direction), line synchronization signals LSYNC (scanning in the primary direction), and data transfer clock signals VCLK. The printer controller 2 outputs the image signal 6, that is, an eight bit signal, for each color component, in synchronism with the data transfer clock signal VCLK.

FIG. 3 is a block diagram of the operation of the printer engine 3 in accordance with the present invention. In FIG. 3, the referential clock from a reference clock generator 10 included in the optical unit 73 is divided by a frequency divider 11. The scanner motor 122 is controlled by a motor control circuit 12 (contained in an unillustrated phase control circuit of a known type) so that it rotates at a constant speed, maintaining a predetermined phase difference between the divided reference clock and the feedback signal from the scanner motor 122. The rotation of the scanner motor 122 is transmitted to the polygon mirror 121, rotating the polygon mirror 121 at a constant speed.

Meanwhile, an intermediary transfer unit 66 is rotated by a motor (unillustrated), and a predetermined point (mark) of the intermediary transfer unit 66 is detected by a detector 8, a vertical synchronization signal VSYNC is generated by the detector 8. Based on this vertical synchronization signal, the positioning of the leading edge of each color toner image is controlled in response to the vertical synchronization signal VSYNC. After the vertical synchronization signal VSYNC is outputted, image signals VDO are sequentially sent to the semiconductor laser 120 in synchronization with BD signals, as the horizontal synchronization signals HSYNC, generated by the detector 9.

A built-in CPU 14 of the signal processing section 4 exchanges control signals with the printer controller 2 in the form of serial communication through a communication line 15, so that the operations of the printer controller 2 and the printer engine 3 remain synchronized. Further, the CPU 14 communicates with the memories 203–206 of the developing devices, the memory 207 for the photosensitive drum 71, and a backup memory 230, through a serial communication line 202. The memories 203–206 are EEPROM's, and are attached to the corresponding developing devices. The memory 207 is also an EEPROM, and is attached to a process cartridge 90, that is, a photosensitive drum cartridge.

Figure 4:
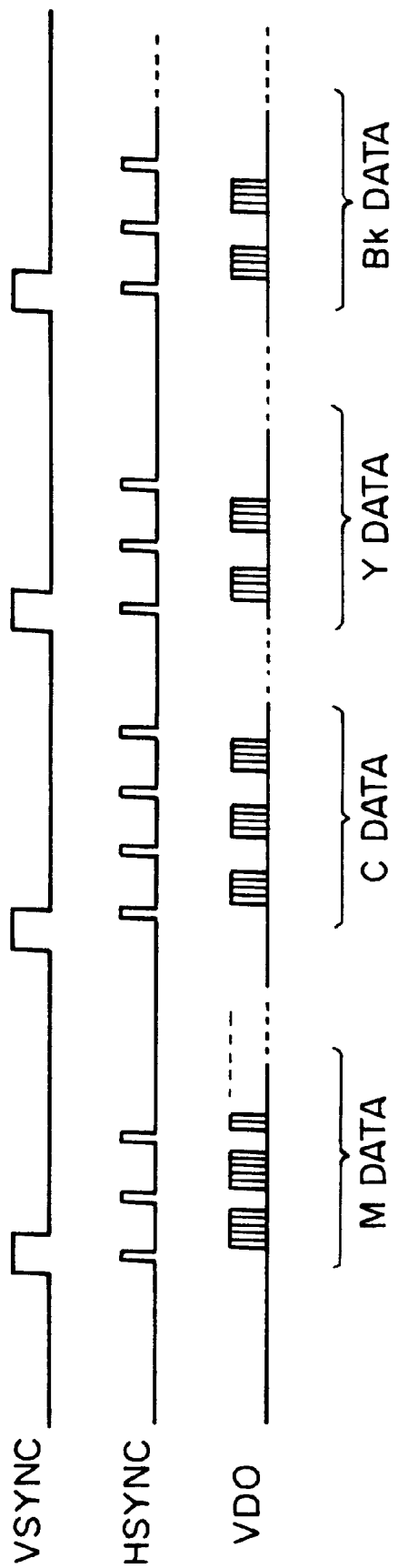
FIG. 4 is a timing chart for the image forming process of the color laser beam printer illustrated in FIG. 1, and depicts the relationship among a vertical synchronization signal (VSYNC), a horizontal synchronization signal (HSYNC), and a video signal (VDO).

The timing for the aforementioned vertical synchronization signal VSYNC, horizontal synchronization signal HSYNC, and image signal VDO is as shown in FIG. 4.

Figure 5:
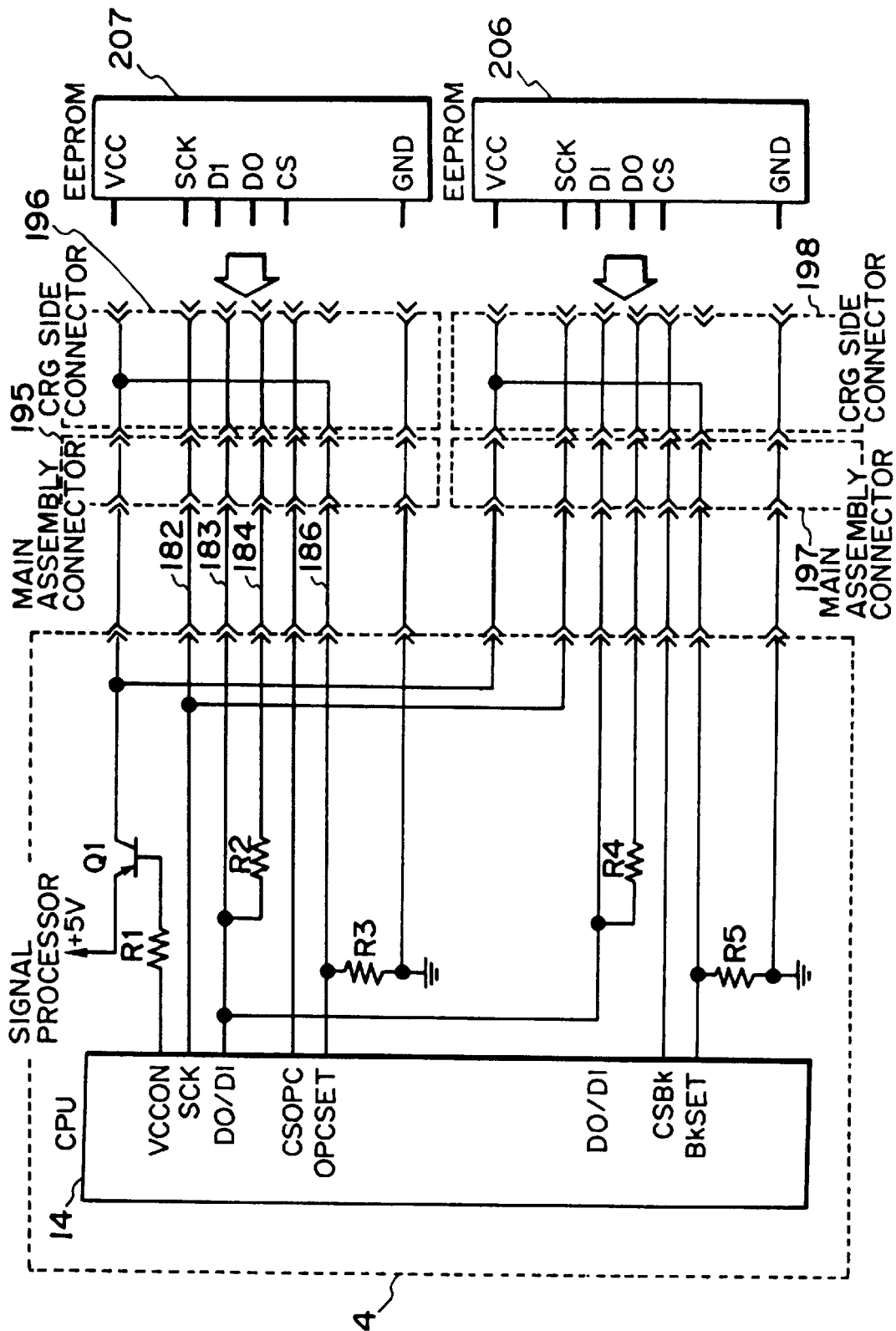
FIG. 5 is a circuit diagram which depicts signal exchange made among the signal processing section, the black color developing device, and the photosensitive drum memory, through the connector in one of the embodiments of the present invention.

FIG. 5 is a circuit diagram pertaining to the signal exchange between the signal processing section 4 and the memory 206 for the black color developing device, and between the signal processing section 4 and the memory 207 for the photosensitive drum.

Figure 8:
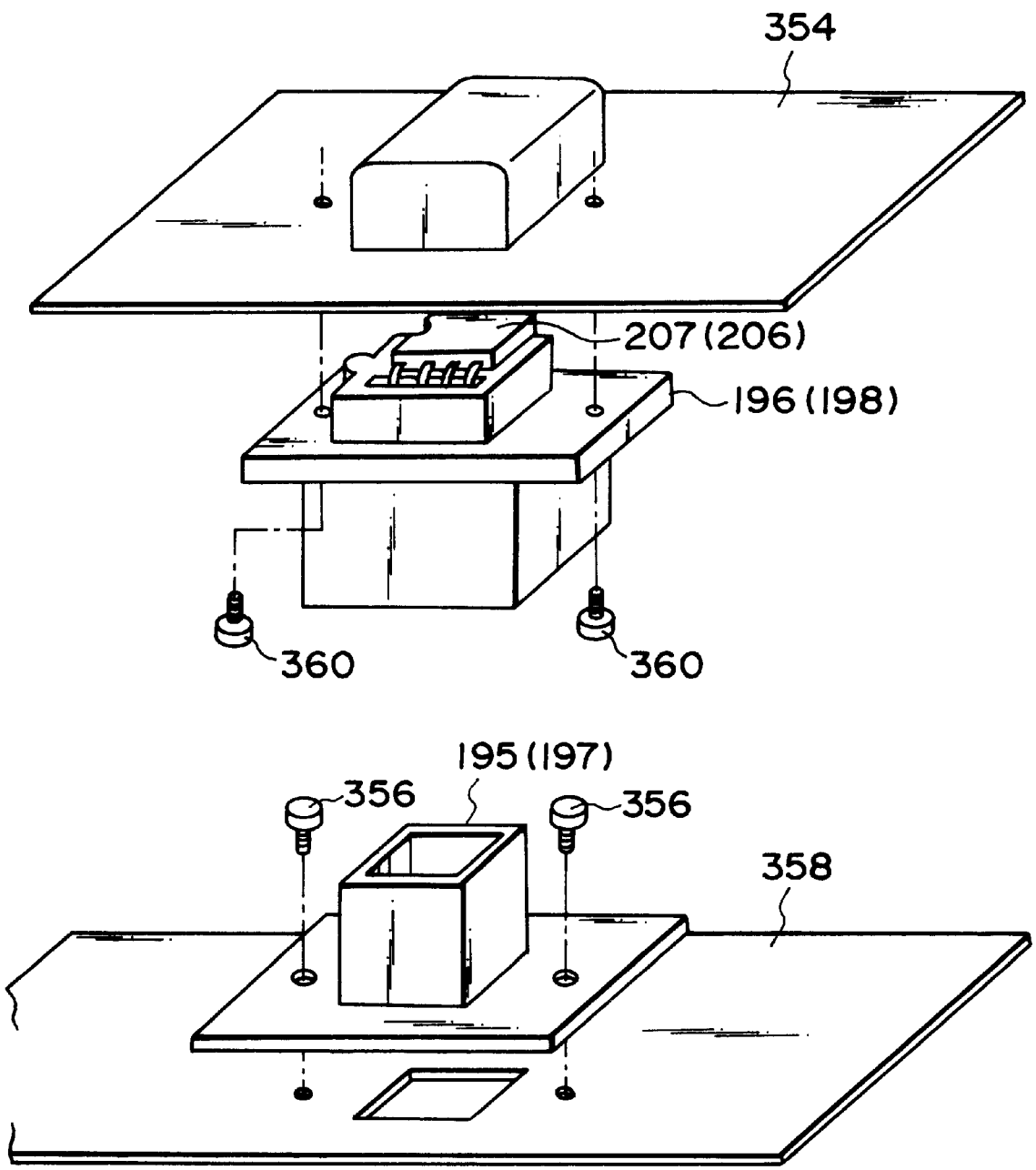
FIG. 8 is an exploded perspective view of an electrical connector in one of the embodiments of the present invention, illustrating the connector on the cartridge side and the connector on the main assembly side.

Referring to FIG. 8, one half of the connector 196 (first connector) on the process cartridge 90 side (CRG side) constitutes the main socket, and the other half constitutes the socket for an TC. The memory 207 for the photosensitive drum, that is, the EEPROM 207, is indirectly attached to the process cartridge 90, and it is inserted in the IC socket of the connector 196 attached to the process cartridge 90. Thus as the connector 196 is fitted with the connector 195 (second connector) attached to the main assembly 13 of the printer, and signals are enabled to be sent to the CPU 14 of the signal processing section 4.

The voltage Vcc supplied to the EEPROM 207 is turned on or off by the CPU 14. When the VCCON at the CPU port is LOW, the power source is ON, and when it is HIGH, the power source is OFF. The CPU 14 turns on the power supply during a read or write operation of the EEPROM. During a read operation, the CPU 14 reads a data signal 184 in synchronism with a clock signal 182, and during a write operation, it outputs a data signal 183, which is written into the EEPROM in synchronism with he clock signal 182. A signal 186 is a signal pertaining to the presence or absence of the photosensitive drum. When the level of the signal 186 is LOW, the CPU determines that a process cartridge 90 is absent, and when the level of the signal 186 is HIGH, it determines that a photosensitive drum is present. More specifically, regarding the level of the signal 186, as a process cartridge 90 is inserted into the main assembly 13 of the printer, the connectors 195 and 196 become engaged. Then, the voltage Vcc of the EEPROM is returned to raise the level of the signal 186 to HIGH.

The connector 198 on the CRG side is attached to the development cartridge for black color, with the EEPROM 206 for the developing device for black color being inserted in the socket thereof. Its signal exchange with the CPU is the same as the signal exchange of the process cartridge 90 with the CPU.

Figure 6:
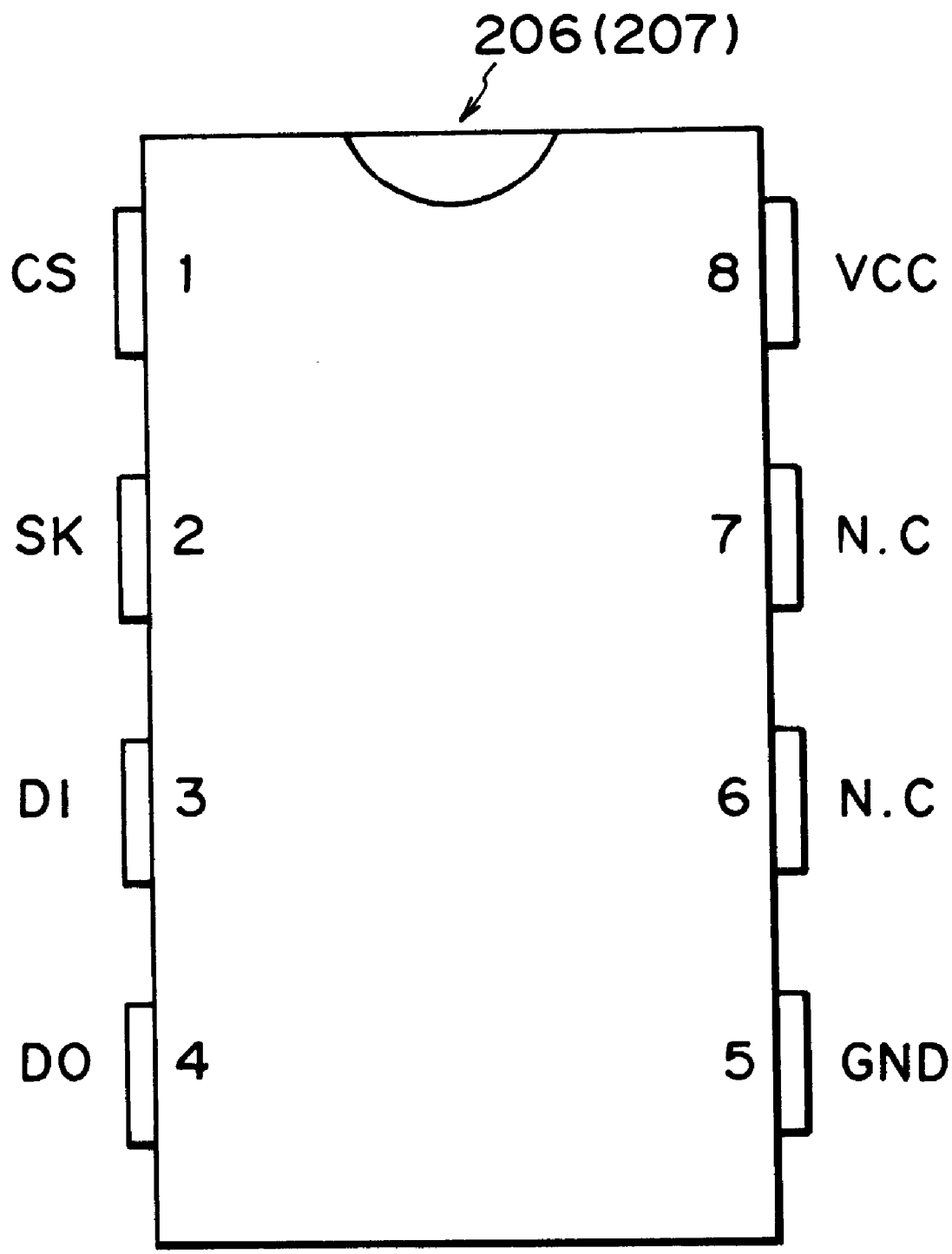
FIG. 6 is a schematic drawing of a Dip-type EEPROM-IC, showing the pin arrangement thereof.

The EEPROM's 207 and 206 both are DIP type IC's (integrated circuits), and are directly connected to the connectors 196 and 198 on the CRG side, respectively. FIG. 6 shows an example of pin arrangement for a DIP type EEPROM-IC.

Figure 7:
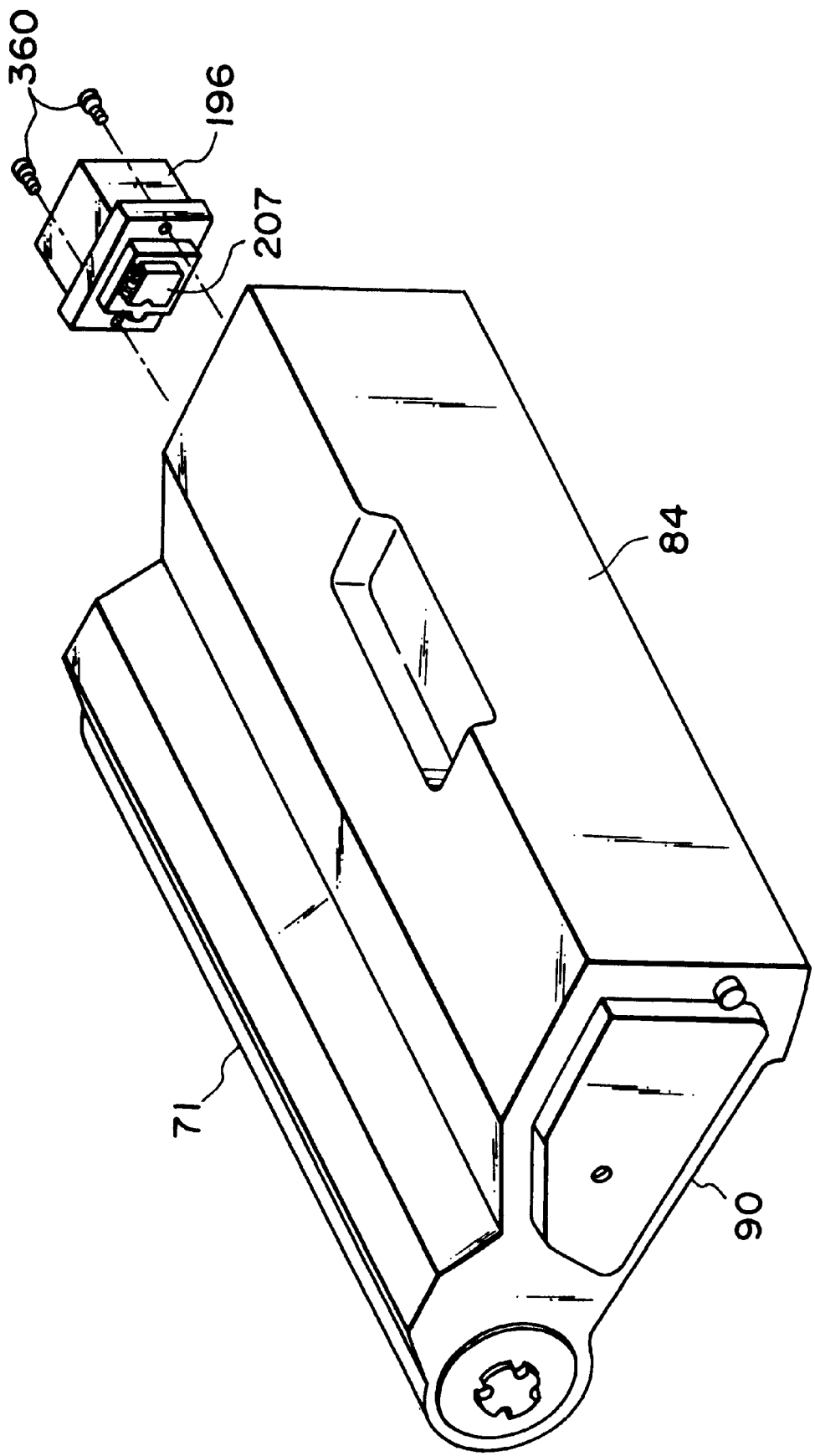
FIG. 7 is a perspective view of a process cartridge (photosensitive drum cartridge).

FIG. 7 shows how the process cartridge 90, the EEPROM 207, and the connector 196 on the cartridge side, are put together. The process cartridge 90 comprises the photosensitive drum 71, the toner container 84 for the removed toner, the EEPROM 207, the connector 196 on the cartridge side, and screws 360 for attaching the connector 196 to the cartridge 90.

FIG. 8 shows the configurations of the connector 196 (or 198) on the cartridge side, the connector 195 (or 197) on the main assembly side, and the EEPROM 207 (206). As is evident from the drawing, the connector 196 on the cartridge side is fixed to the connector mount portion 354 of the process cartridge 90 with the use of the screws 360. The connector 195 on the main assembly side is fixed to the mount portion 358 of the main assembly with the use of the screws 356.

Figure 9:
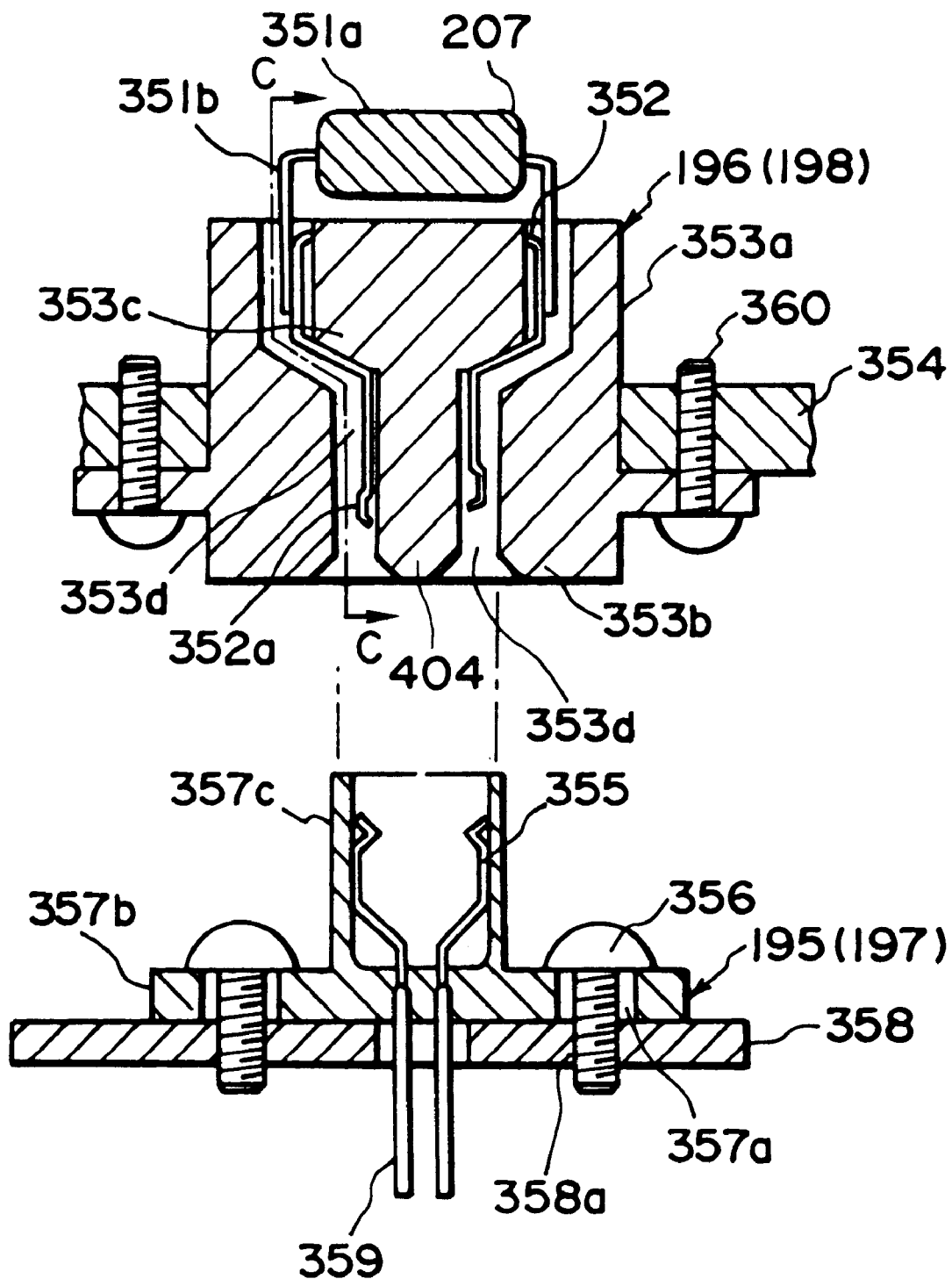
FIG. 9 is a section of the connector illustrated in FIG. 8.

FIG. 9 is a longitudinal section of the connector 196 (or 198) on the cartridge side, and the connector 195 (or 197) on the main assembly side, which are illustrated in FIG. 8.

In this embodiment, the connector main structure 196 (198) on the process cartridge side contains contacts 352 which are placed in contact with the EEPROM 207. This connector main structure 196 (198) on the process cartridge side is fixed to the process cartridge 90. As for the connector main structure 195 (197) on the image forming apparatus main assembly side, which is the counterpart of the connector main structure 196 (198) on the process cartridge side, it is fixed to the connector mount 358, that is, a part of the image forming apparatus main assembly, with the use of the small screw 356. However, since the connector main structure 196 (198) attached to the process cartridge 90 side is firmly fixed to the process cartridge 90, it is necessary to make it sure that imperfect alignment between the process cartridge 90 and the image forming apparatus main assembly 13 does not generate stress in the connector main structures 196 (198) and 195 (197). Therefore, the connector main structure 195 (197) on the image forming apparatus main assembly side must be floatingly attached to the connector mount 358 of the image forming apparatus main assembly 13. FIG. 9, a sectional view, depicts a connector designed in consideration of such a requirement. More specifically, the diameter of the hole 357a of the connector main structure 195 (197) on the image forming apparatus main assembly side is rendered slightly larger than that of the small screw 356 to create a gap large enough to compensate for the aforementioned misalignment. Therefore, even though the small screw 356 is firmly screwed into the female screw threads 358a of the connector attachment portion 358 of the image forming apparatus main assembly, the connector main structure 195 (197) on the image forming apparatus main assembly side is floatingly attached to the connector mount 358 of the image forming apparatus main assembly 13.

The connector main structure 196 (198) on the process cartridge side is formed of synthetic resin. It is hollow, and has a substantially square cross-section. Its base side half (top side in the drawings) is larger than its engagement portion side (bottom side in the drawings). The internal space of the connector main structure 196 (198) on the process cartridge side is occupied by the IC mount 353c. The IC mount 353c is integrally formed with the connector main structure 196 (198), or is first formed independently from the connector main structure 196 (198), and then, attached to the external wall portion 353a and engagement portion wall 353b of the connector main structure 196 (198). The longitudinal section of the IC mount 353c is in the form of a character T as shown in FIG. 9. The surface of the IC moment 353c and the base side external wall 353a, and the surface of the IC mount 353c and the engagement portion side external wall 353b, form a continuous terminal mounting space 353d which opens outward at the top and bottom. The contacts 352 exclusive of portions 352a and, the bottom end portions, are disposed in the IC mounting space, substantially in contact with the IC mount 353c. More specifically, the bottom end of the contact 352 is bent outward to form the contact portion 352a. As for the EEPROM 207, the main structure 351a of a chip is disposed directly above the IC mount 353c, with the provision of a predetermined gap. The lead wires (pins) 351b of the IC 207 are inserted from above into the electrode mounting space 353d, and are made to directly press on the contact 352.

The connector main structure 195 (197) on the image forming apparatus main assembly side integrally comprises a mount portion 357b provided with the aforementioned holes 357a for the small screw, and an engagement portion 357c in the form of a rectangular parallelepiped. Wiring 359 is connected to a contact 355 fixed to the connector main structure 195 (197) on the image forming apparatus main assembly side. The contact 355 is in contact with the internal surface of the engagement portion 357c. As the process cartridge 90 is inserted into the image forming apparatus main assembly 13, the internal periphery 353b of the connector main structure 196 (198) on the process cartridge side fits against the external periphery 357c of the connector main assembly structure 195 (197) on the image forming apparatus main assembly side, and the contact portion 352a of the contact 352 on the process cartridge side is pressed against the contact 355 on the image forming apparatus main assembly side, being elastically bent inward, and establishes an electrical connection. To a contact 359, a cable connector 401 (FIG. 12) is connected to allow signals to be transmitted to other units.

Figure 10:
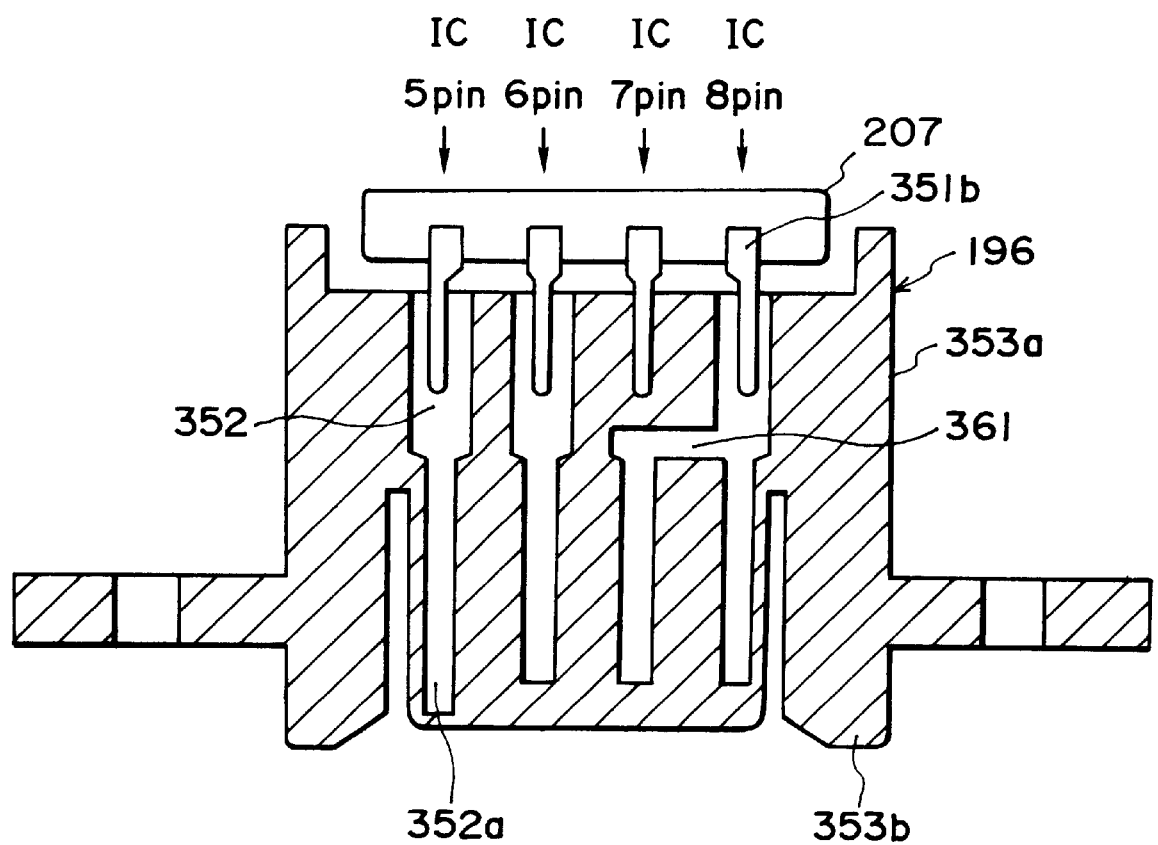
FIG. 10 is an enlarged section of the connector on the cartridge side.

FIG. 10 is a section of the connector 196 on the cartridge side, having been horizontally rotated 90 deg. from the position illustrated in FIG. 9; it is a sectional drawing at a plane C—C passing through the fifth to eight pins of the EEPROM IC. As shown in the drawing, no contact 352 is in connection with the seventh pin of the IC. The contact 352 connected to the eighth pin (electrical power source Vcc) of the IC branches into two (portion 361) portions which extend to the engagement portion 352b.

The contact corresponding to the fifth pin, the GND pin, of the IC is rendered longer than the other contacts so that the contact corresponding to the fifth pin is first connected when the connector 196 is engaged with the connector 195, and is disconnected last when the connectors are disengaged. With this arrangement, even when static electricity is accumulated in the EEPROM 207, it is discharged through the GND pin before the other contacts are connected to their counterparts, and therefore, the input/output port of an EEPROM 207 is prevented from being damaged by the static electricity when the connectors are engaged.

Figure 11:
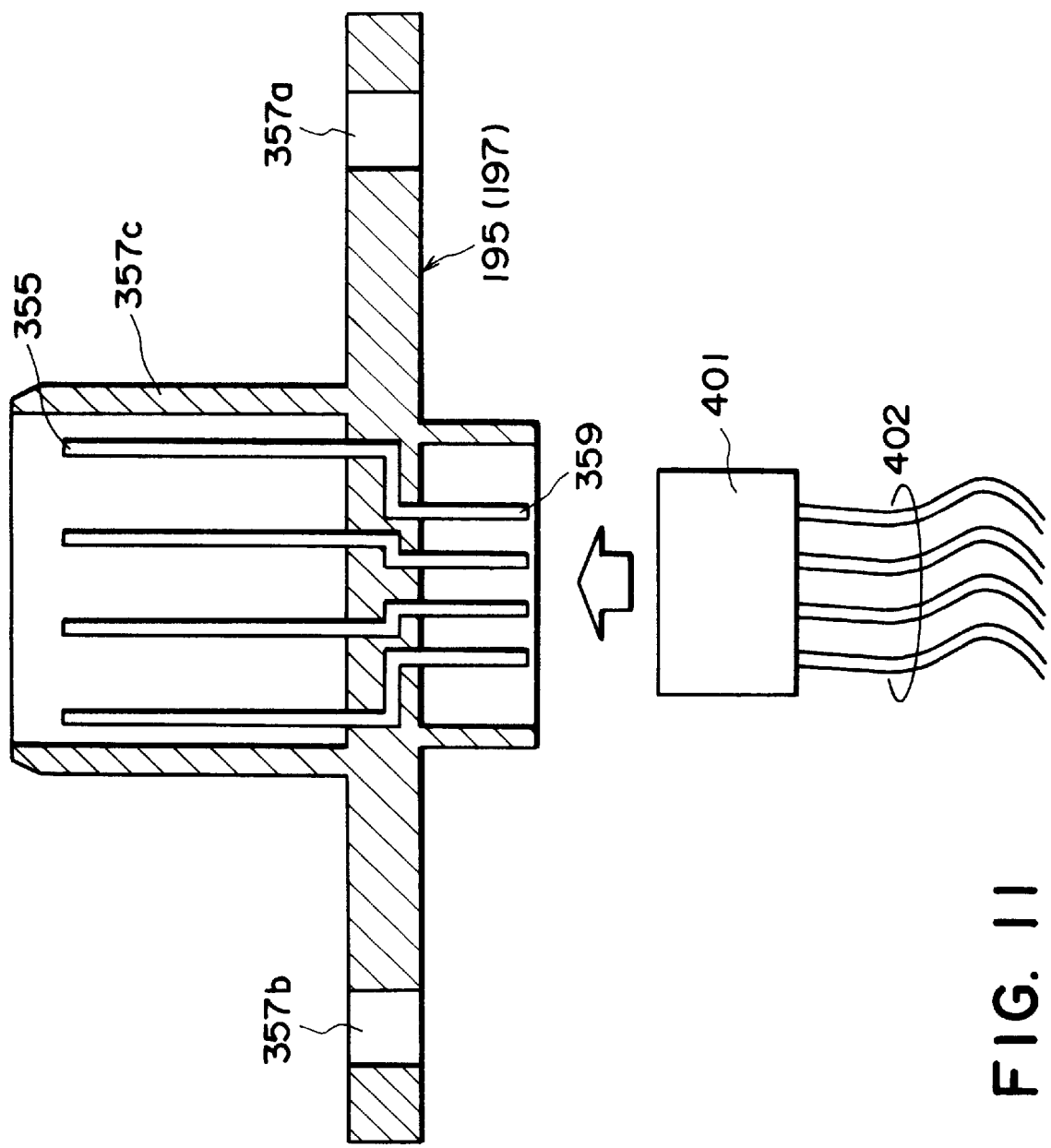
FIG. 11 is a vertical section of a connector on the main assembly side of an image forming apparatus.

FIG. 11 is a section of the apparatus main assembly side connector 195, at a plane perpendicular to the plane of the drawing in FIG. 9 in terms of vertical rotation. In FIG. 11, the contact 359 is connected to the universal connector 401 connected to a cable 402. Generally, the distance between the immediately adjacent two contacts of the universal connectors 401 is approximately 2.0 mm, 1.5 mm or 1.0

On the other hand, the surface of the contact 355 constitutes a surface which engages with the cartridge side connector 196.

Figure 12:
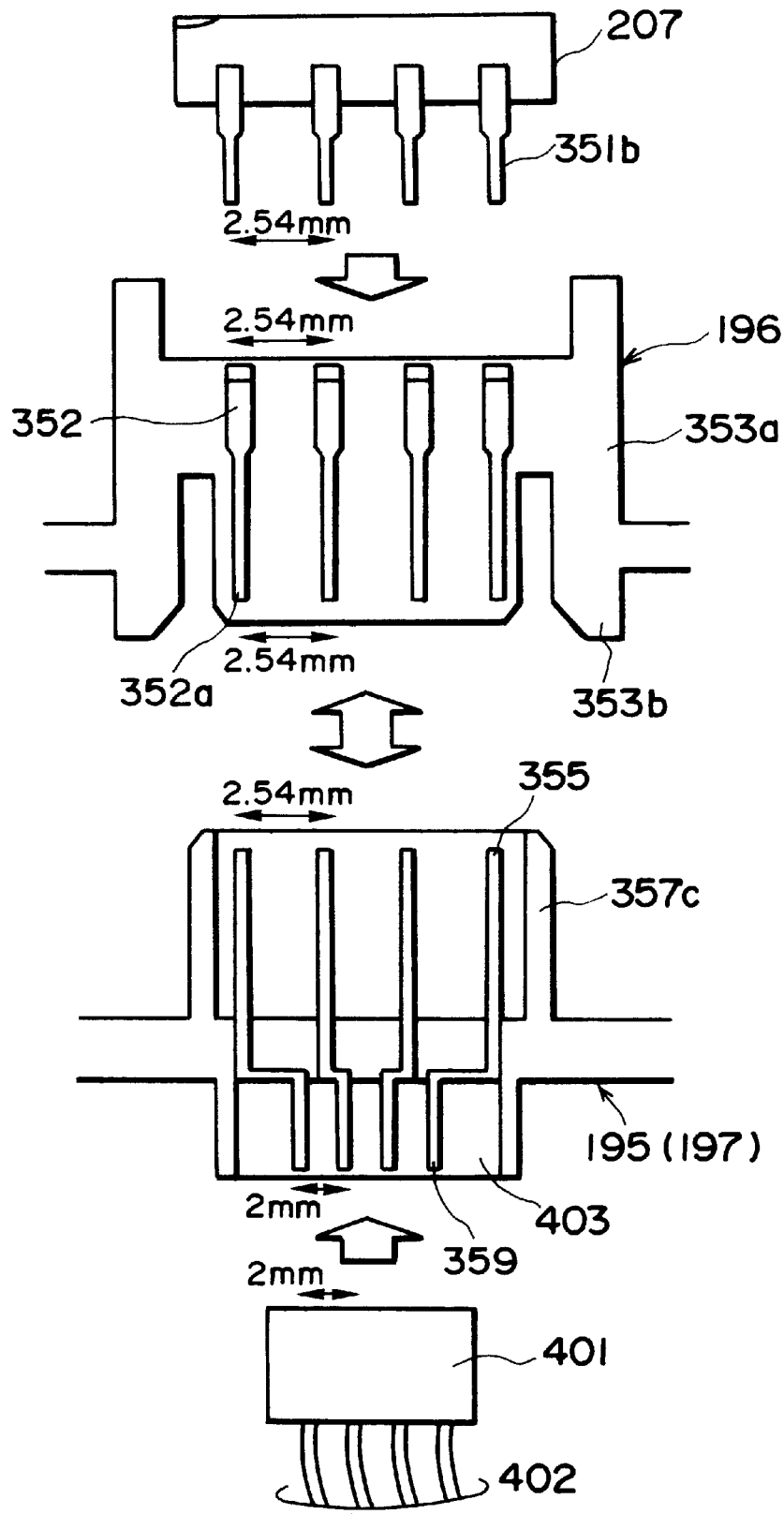
FIG. 12 is a schematic drawing which shows the distances between the adjacent two contacts of a cartridge side connector, a main assembly side connector, a universal cable connector, and a memory IC.

FIG. 12 is a schematic sectional drawing which is focused upon the distance s between the immediately adjacent two contacts in the EEPROm 207, the cartridge side connector 196, the image forming apparatus main assembly side connector 195, and the universal cable connector 401.

The EEPROM 207 is a DIP type IC, and generally, the distance between the adjacent two IC leads is 2.54 mm.

The distance between the adjacent two contacts of the cartridge side connector 196, on the side to which the EEPROM 207 is inserted, is 2.54 mm, and so is the distance between the adjacent two contacts of the cartridge side connector 196, on the side to which the image forming apparatus main assembly side connector 195 is engaged. With this arrangement, therefore, the cartridge side contact 352 may be straight; in other words, all contacts 352 may be the same in configuration, contributing to a cost reduction. Incidentally, FIG. 12 is a sectional drawing at a plane passing through the pins 1 to 4 of the IC.

The distance between the adjacent two contacts of the image forming apparatus main assembly side connector 195 is approximately 2.54 mm, on the side to which the cartridge side connector 196 is engaged, and is approximately 2.00 mm, on the side to which the universal cable connector 401 is connected. In other words, the distance between the adjacent two contacts on the side to which the cartridge side connector 196 is engaged is different from the distance between the adjacent two contacts on the side to which the universal cable connector 401 is engaged, and therefore, a plurality of different contacts are necessary, which contributes to the increased cost of the device. However, this arrangement allows the usage of the universal cable connector 401, that is, a cable connector with a universal contact pitch, which is inexpensive, and also, this arrangement reduces the size of the area occupied by the circuit board to which the other end of the cable 402 is connected.

The distance between the adjacent two contacts (unillustrated) of the universal cable connector 401 is approximately 2.00 mm. It may be different from 2.00 mm; for example, 1.50 mm or 1.00 mm. In fact, it seems to be quite feasible that in the near future, product size will be further reduced, which will lead to the further reduction in circuit board size, and as a result, a cable connector in which the distance between the adjacent two contacts is even narrower than those mentioned above will become very common.

Figure 13:
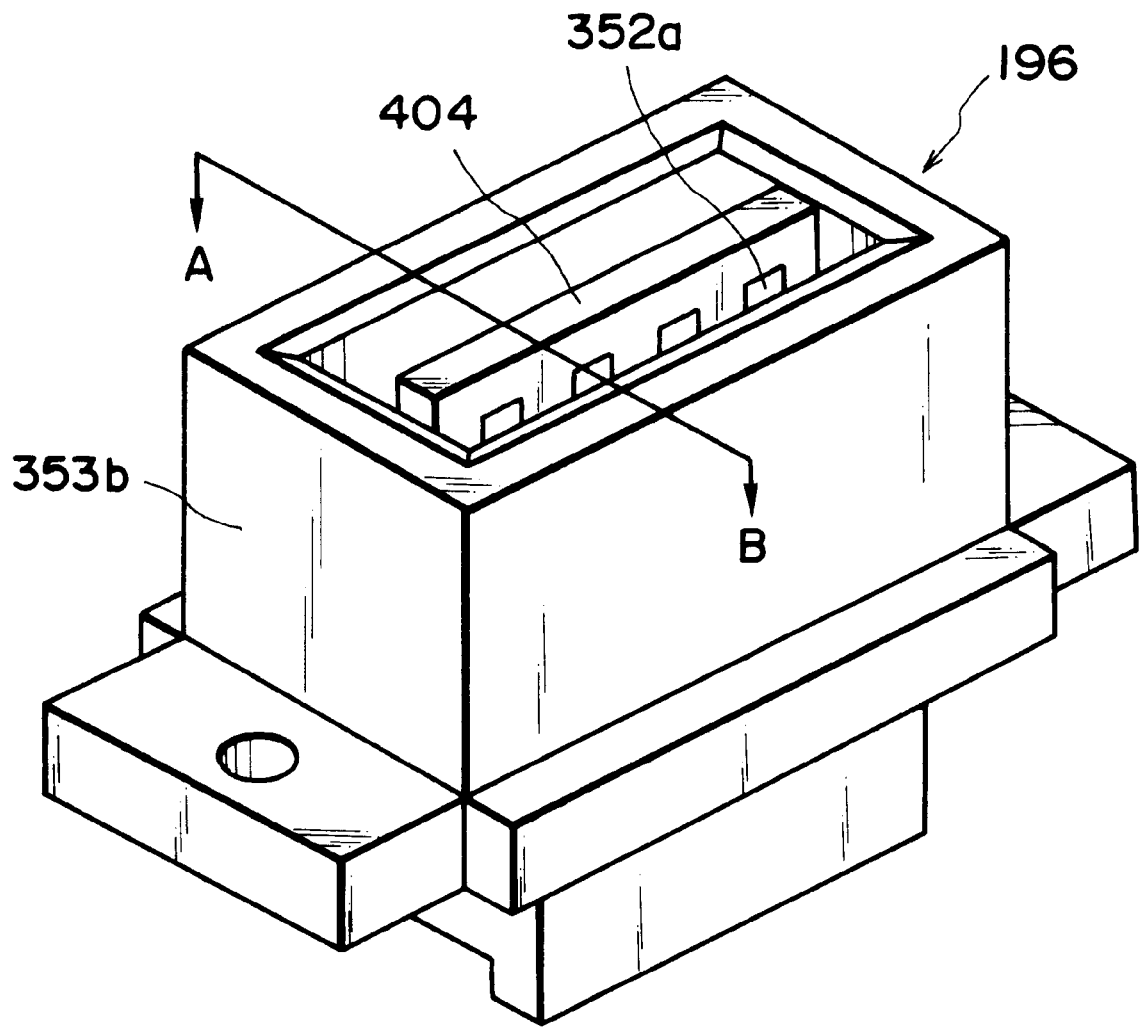
FIG. 13 is a perspective view of a cartridge side connector.
Figure 14:
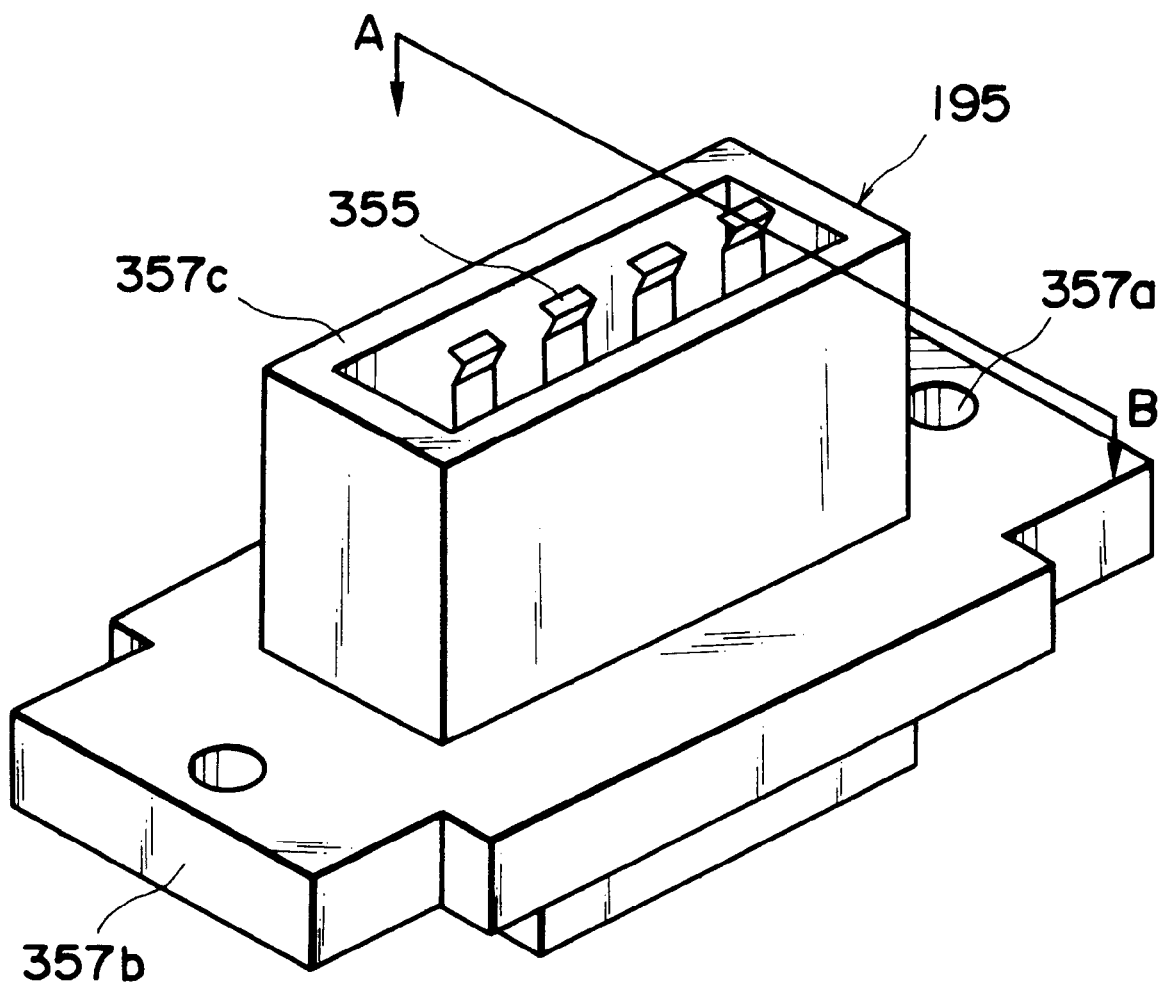
FIG. 14 is a perspective view of a main assembly side connector.
Figure 15:
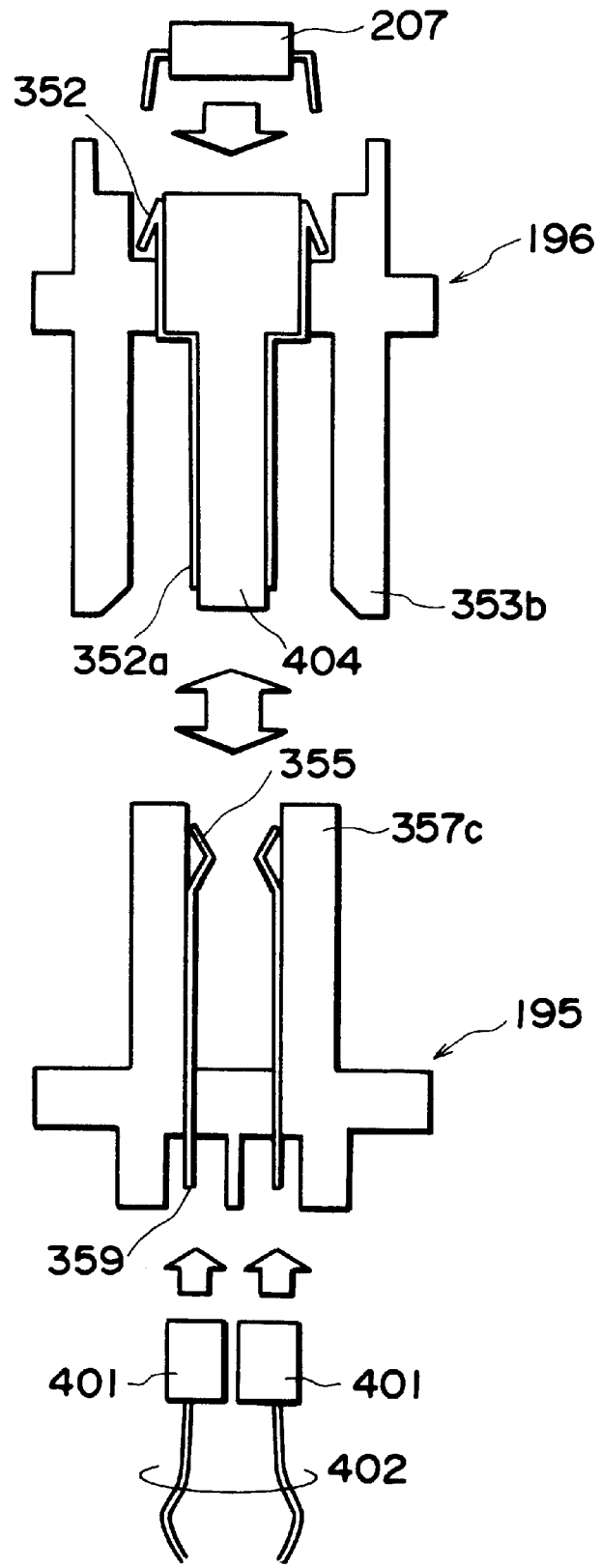
FIG. 15 is a section of the combination of the connectors illustrated in FIGS. 13 and 14, at the plane indicated by "A-B" in the drawings.

FIGS. 13–15 are drawings for depicting the engaging portions of the image forming apparatus main assembly side connector 195 and the cartridge side connector 196.

FIG. 13 is a perspective view of the cartridge side connector 196 as seen from diagonally above the engaging side. As is evident from the drawing, this connector is of a receptacle type; in other words, a contact mount portion 404 to which contact portion 352a is attached is disposed in the internal space of the engaging portion 353b, or the receptacle frame. The contact portions 352a are attached to both surfaces of the contact mount portion 404. The engaging portion 353b plays a role in protecting the contact portions 352a, and guiding the connectors when the connectors are engaged.

FIG. 14 is a perspective view of the image forming main assembly side connector 195 as seen from diagonally above the engaging side. As is evident from the drawing, this connector is of a plug type; the contacts 355 are attached to both of the larger internal walls of the engaging portion 357c (FIG. 9).

FIG. 15 is a sectional drawing comprising the cross section of the connector depicted in FIG. 13, at a plane A-B in FIG. 13, and the cross section of the connector depicted in FIG. 14, at a plane A-B in FIG. 14. The contacts 355 of the image forming main assembly side connector 195 are bent in the form of a reversely placed character "V", placing the portion equivalent to the pointed portion of "V" away from the wall to assure desirable electrical connection between the contacts 355 and the corresponding contact portions 252a. Therefore, when the image forming main assembly side connector 195 and the process cartridge side connector 196 are in engagement with each other, the contact mount portion 404 is in a state of being pinched by the plurality of contacts 355. In FIG. 15, the EEPROM 207 is a memory in the form of an IC, and the component designated by a referential FIG. 401 is a connector to which a cable has been connected. In this embodiment, two universal cable connectors 401 with four pins are employed, but a single universal cable connector 401 with eight pins may be employed. Further, a single dummy pin may be added; in other words, a universal cable connector may be produced in two different forms, a tour pin form and a five pin form, to prevent the universal cable connectors from being engaged with the wrong counterpart during apparatus assembly.

The contents of the EEPROM 207 attached to the process cartridge 90 are, for example, as follows:

A) a value indicating the remaining service life of a photosensitive drum.

B) a value indicating the remaining capacity of a waste toner bin.

C) a value indicating the production number of a process cartridge.

D) a value indicating the threshold of the remaining service life of a photosensitive drum E) a value indicating the level of the primary charge voltage.

In this embodiment, the EEPROM 207 was described with reference to the process cartridge 90, that is, a photosensitive drum cartridge. However, the development cartridge for a magenta color, the development cartridge for a cyan color, the development cartridge for a yellow color, and the development cartridge for a black color may be provided with an EEPROM, which will be attached in the same manner as it is attached to the process cartridge 90. Further, any of the exchangeable units, for example, the fixing apparatus 78, the intermediary transfer unit 66, or the developing means comprising both the developing member and the toner, which can be exchanged by a user, may be provided with an EEPROM.

Further, a process cartridge 90, in which a photosensitive drum 71, a developing device which contains developer, and a waste toner bin, may be provided with the connector and the memory described above.

Also, in this embodiment, the EEPROM was described as a memory in the form of an IC, but it may be in the form of a nonvolatile memory.

Embodiment 2

Figure 16:
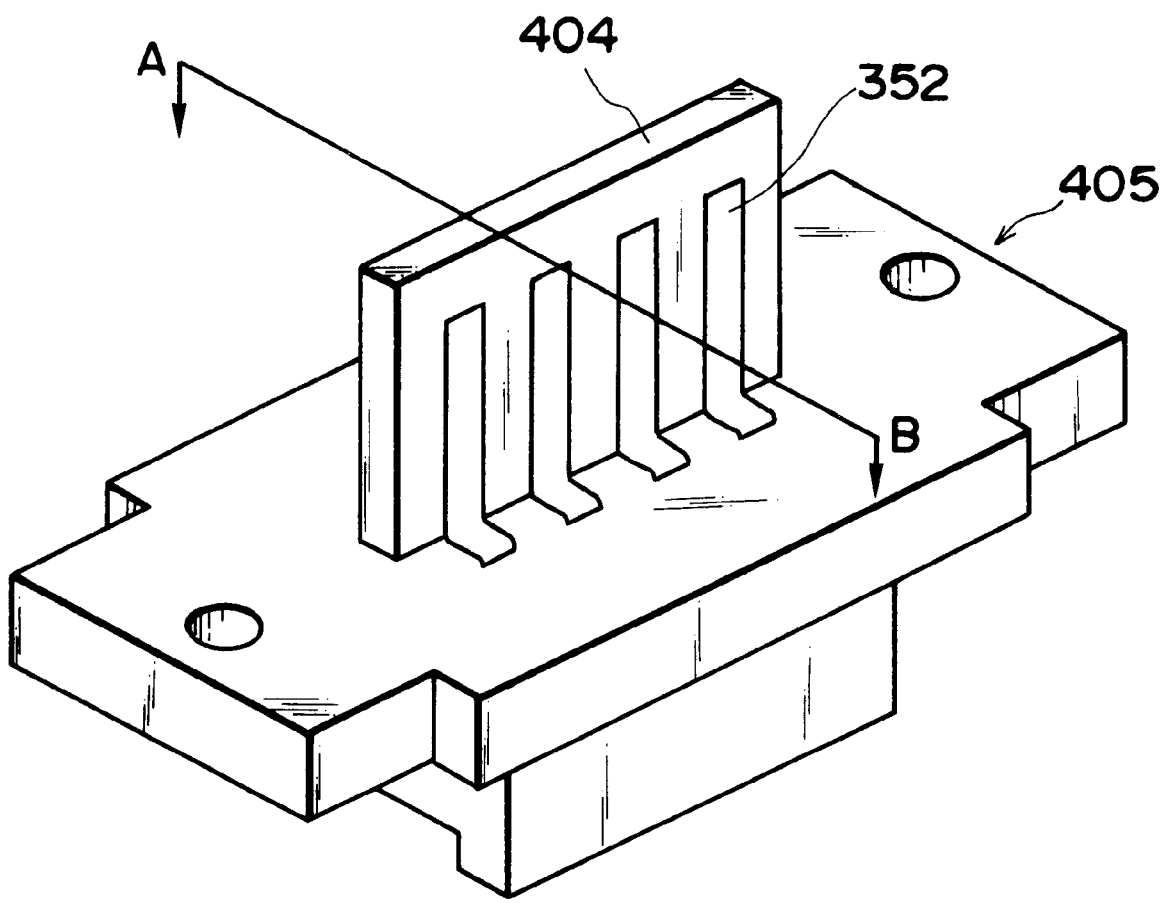
FIG. 16 is a perspective view of the cartridge side connector in the second embodiment of the present invention.
Figure 17:
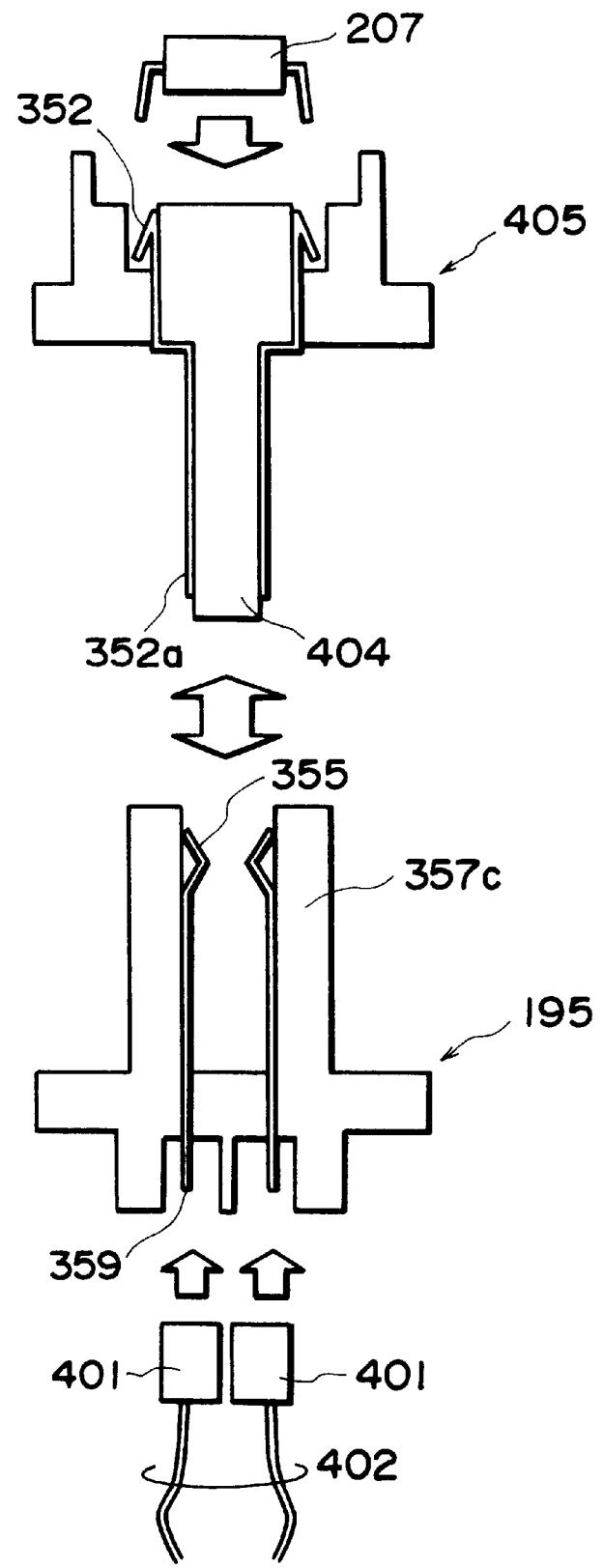
FIG. 17 is a vertical section of a main assembly side connector and a cartridge side connector.

FIGS. 16 and 17 are drawings which depict the second embodiment of the present invention, depicting the engaging portions of an image forming main assembly side connector 195 and a cartridge side connector 405, respectively.

FIG. 16 is a perspective view of the cartridge side connector 405 as seen from the side of the engaging portion. As is evident from the drawing, this cartridge side connector 405 is also of a receptacle type, but is different from the cartridge side connector 196 in the first embodiment in that a contact mount portion 404 to which contacts 352a are attached is not surrounded by walls, although the contacts 352a are attached to both sides of the contact mount portion 404.

Since the image forming main assembly side connector 195 is identical to the image forming main assembly side connector 195 in the first embodiment, its description is omitted here by referring to FIG. 14.

FIG. 17 is a sectional drawing comprising the cross section of the connector depicted in FIG. 16, at a plane A-B in FIG. 16, and the cross section of the connector depicted in FIG. 14, at a plane A-B in FIG. 14. The contacts 355 of the image forming main assembly side connector 195 are bent in the form of a reversely placed character "V", placing the portion equivalent to the pointed portion of "V" away from the wall to assure that the contacts 355 are desirably engaged with the correspondent contacts 352a. Therefore, when the image forming main assembly side connector 195 and the process cartridge side connector 196 are in engagement with each other, the contact mount portion 404 is in a state of being pinched by the plurality of contacts 355. In FIG. 17, an EEPROM 207 is a memory in the form of an IC, and the component designated by a referential figure 401 is a connector to which a cable 402 has been connected. According to this embodiment, the cost of a cartridge side connector 405 can be further reduced, and at the same time, the size of the space which the cartridge side connector 405 takes away from the process cartridge 90 can also be reduced, which greatly contributes to the cost and size reduction of the process cartridge 90 itself.

In the preceding embodiments, the present invention was described with reference to a multicolor laser beam printer. However, the present invention is also applicable to a monochrome process cartridge comprising the developing means or the like which were depicted in the first portion of the section, "Detailed Description of the Preferred Embodiments". Further, an image forming apparatus to which the present invention is applicable is not limited to an image forming apparatus of an electrophotographic type; the present invention is also applicable to a nonelectrophotographic image forming apparatus, a nonelectrophotographic recording apparatus, or the like.

As described above, according to the preceding embodiments, a memory is directly held by a connector on the process cartridge (photosensitive drum cartridge) side or a like processing unit, and the difference in pitch between the IC memory pin and the cable connector contact is adjusted on the image forming apparatus main assembly side connector side. Therefore, the contents of the following list can be realized:

(1) To provide an inexpensive small connector comprising an electronic memory device such as an EEPROM in the form of an IC; a processing unit or a process cartridge comprising such a connector; and an image forming apparatus compatible with such a processing unit or a process cartridge.

(2) To manage a processing unit or a processing cartridge in a highly reliable manner based on the data pertaining to, for example, the remaining service life of the unit or the cartridge; this object can be realized since the data, such as the remaining service life of the unit or cartridge, can be stored in the IC type memory mounted on the unit or cartridge side.

(3) To reduce the cost of the connector mounted on the processing unit or the processing cartridge which is a consumable product; this object can be realized since the structure of the contacts of a process cartridge side connector is simplified.

(4) To make it possible to employ an inexpensive cable connector; this object can be realized since the contact pitch of an image forming apparatus main assembly side connector, on the side which engages with a cable connector, is rendered the same as the contact pitch of a cable connector.

Further, according to the preceding embodiments, a connector of a receptacle type is disposed on the process cartridge side, and a connector of a plug type is disposed on the image forming apparatus main assembly side, and therefore, the following can be realized:

(5) To protect the interior of the image forming apparatus main assembly from the scattering of toner particles; this object can be realized since a plug type connector has a smaller opening than a receptacle type connector, and the contacts of a plug type connector face inward.

(6) To give an image forming apparatus main assembly side a long service life, which is very important since the service life of the main assembly of an image forming apparatus is much longer than the service life of a process cartridge.

As described above, according to the present invention, a reliable electrical connection is assured between a processing unit or a processing cartridge, and the main assembly of an apparatus in which the unit or the cartridge is installed.

While the invention has been described with reference to the structures disclosed herein, it is not confined to the details set forth and this application is intended to cover such modifications or changes as may come within the purposes of the improvements or the scope of the following claims.

What is claimed is:

1. A couple of electric connectors for electric connection, comprising:

a first connector having first electrical contacts and having a memory; and a second connector, having second electrical contacts adjacent one end for electric connection with said first connector and having third electrical contacts adjacent another end for connection with a cable connector, for transmission of a signal of the memory, wherein an interval of said second electrical contacts are different from that of said third electrical contacts, and wherein the interval of said third electrical contacts is smaller than that of the first electrical contacts.

2. A couple of electric connectors according to claim 1, wherein the interval of said first electrical contacts is approximately 2.54 mm.

3. A couple of electric connectors according to claim 1 or 2, wherein the interval of said third electrical contacts is approximately 2 mm.

4. A couple of electric connectors according to claim 1 or 2, wherein the memory is non-volatile.

5. A couple of electric connectors for electric connection, comprising:
- a first connector having memory;
- a second connector, connectable with said first connector, for electric connection with said first connector;
- wherein said first connector has a receptacle structure, and said second connector has a plug structure.

6. A unit detachably mountable relative to a main assembly of an electrophotographic image forming apparatus, wherein said main assembly is provided with a cable connector connecting with a cable, and a second connector having first electrical contacts connecting with the cable connector and second electrical contacts disposed at an interval different from an interval of the first electrical contacts, wherein the interval of said first electrical contacts is smaller than that of the second electrical contacts, said unit comprising:
- (a) a memory; and
- (b) a first connector having memory contacts connecting with said memory and having third electrical contacts for electrical connection with said second electrical contacts of said second connector, wherein an interval of said memory contacts and an interval of said third electrical contacts are the same.

7. A unit according to claim 6, wherein said first connector has a receptacle structure, and said second connector has a plug structure.

8. A unit according to claim 6, or 7 wherein said memory is non-volatile.

9. A unit according to claim 6, wherein said unit is a developing unit for developing a latent image formed on an electrophotographic photosensitive member.

10. A unit according to claim 6, wherein said unit is a toner cartridge for containing toner to be supplied to developing means.

11. A process cartridge detachably mountable relative to a main assembly of an electrophotographic image forming apparatus, wherein said main assembly is provided with a cable connector connecting with a cable, and a second connector having first electrical contacts connecting with the cable connector and second electrical contacts disposed at an interval different from an interval of the first electrical contacts, and wherein the interval of said first electrical contacts is smaller than that of said second electrical contacts, said process cartridge comprising:
- (a) an electrophotographic photosensitive member;
- (b) a process member actable on said electrophotographic photosensitive member;
- (c) a memory; and
- (d) a first connector having memory contacts connecting with said memory and having third electrical contacts for electric connection with said second electrical contacts of said second connector, wherein an interval of said memory contacts and an interval of said third electrical contacts are the same.

12. A process cartridge according to claim 11, wherein said first connector has a receptacle structure, and said second connector has a plug structure.

13. A process cartridge according to claim 11, wherein said memory is non-volatile.

14. A process cartridge according to claim 11, wherein said process member includes at least one of charging means, a developing member and cleaning means.

15. An electrophotographic image forming apparatus for forming an image on a recording material, to which a unit is detachably mountable, said apparatus comprising:
- (a) a cable connector connecting with a cable;
- (b) a second connector having first electrical contacts connecting with said cable and second electrical contacts disposed at an interval different from that of said first electrical contacts, and wherein the interval of said first electrical contacts is smaller than that of the second electrical contacts; and
- (c) a mounting member for detachably mounting the unit, said unit including:
  - a memory; and
  - a first connector having memory contacts connecting with said memory and having third electrical contacts for electric connection with said second electrical contacts of said second connector, wherein an interval of said memory contacts and an interval of said third electrical contacts are the same.

16. An image forming apparatus for forming an image on a recording material, to which a process cartridge is detachably mountable, said apparatus comprising:
- (a) a cable connector connecting with a cable;
- (b) a second connector having first electrical contacts connecting with said cable and second electrical contacts disposed at an interval different from that of said first electrical contacts, wherein the interval of said first electrical contacts is smaller than that of the second electric contacts; and
- (c) a mounting member for detachably mounting the process cartridge, said process cartridge including:
  - an electrophotographic photosensitive member;
  - a process means actable on said photosensitive member;
  - a memory; and
  - a first connector having memory contacts connecting with said memory and having third electrical contacts for electric connection with said second electrical contacts of said second connector, wherein an interval of said memory contacts and an interval of said third electrical contacts are the same.

17. An electric connector for electric connection with a second connector having first electrical contacts connecting with a cable connector connecting with a cable and second electrical contacts disposed at an interval different from that of said first electrical contacts, and wherein the interval of said first electrical contacts is smaller than that of the second electrical contacts, said connector comprising:
- (a) a memory;
- (b) memory contacts connecting with said memory; and
- (c) third electrical contacts for electric connection with said second electrical contacts of said second connector, wherein an interval of said memory contacts and an interval of said third electrical contacts are the same.

18. An electric connector according to claim 17, wherein the interval of said memory contacts is approximately 2.54 mm.

19. An electric connector according to claim 17, wherein the cable connector has electrical contacts arranged at an interval of approximately 2 mm.

20. An electric connector according to claim 17, 18 or 19, wherein the memory is non-volatile.

21. A couple connector of electric connectors for electrical connection, comprising:

a first connector having first electrical contacts and having a memory; and a second connector having second electrical contacts adjacent one end for electrical connection with said first connector and having third electrical contacts adjacent another end for connection with a cable connector for transmission of a signal of the memory, wherein the interval of said second electrical contacts is different from that of said third electrical contacts, wherein the interval of said third electrical contacts is smaller than that of said first electrical contacts, wherein the interval of said first electrical contacts is approximately 2.54 mm, wherein the interval of said third electrical contacts is approximately 2 mm, wherein said memory is non-volatile, and wherein said first connector has a receptacle structure, and said second connector has a plug structure.

22. A couple of electrical connectors according to claim 21, wherein a main assembly of an electrophotographic image forming apparatus is provided with the cable connector, wherein said main assembly is provided with said second connector, wherein a process cartridge is detachably mountable relative to said main assembly, wherein said process cartridge comprises said first connector, an electrophotographic photosensitive member, and a process member actable on said electrophotographic photosensitive member, wherein said process member includes at least one of a charging member, a developing member, and a cleaning member.

23. A process cartridge detachably mountable relative to a main assembly of an electrophotographic image forming apparatus, wherein said main assembly is provided with a cable connector connecting with a cable, and a second connector having first electrical contacts connecting with the cable connector and second electrical contacts disposed at an interval different from an interval of the first electrical contacts, and wherein the interval of the first electrical contacts is smaller than that of said second electrical contacts, said process cartridge comprising:

(a) an electrophotosensitive member;

(b) a process member actable on said electrophotographic photosensitive member;

(c) a memory; and (d) a first connector having memory contacts connecting with said memory and having third electrical contacts for electrical connection with said second electrical contacts of said second connector, wherein an interval of said memory contacts and an interval of said third electrical contacts are the same, wherein said first connector has a receptacle structure, and said second connector has a plug structure, wherein said memory is non-volatile, and wherein the interval of said third electrical contacts is approximately 2.54 mm, and the interval of said first electrical contacts is approximately 2 mm.

24. An electrical connector according to claim 23, wherein said process member includes at least one of a charging member, a developing member, and a cleaning member.

* * * * *

UNITED STATES PATENT AND TRADEMARK OFFICE
CERTIFICATE OF CORRECTION

PATENT NO. : 6,014,533
DATED : January 11, 2000
INVENTOR(S) : Takashi KAWANA

It is certified that error appears in the above-identified patent and that said Letters Patent is hereby corrected as shown below:

IN THE FIGURES:

Sheet 3, Figure 3, In box 10, "OSSCILATOR" should read --OSCILLATOR-- and "DIDIVED" should read --DIVIDED--.

COLUMN 1:

Line 16, "means" should read --refers to--.
Line 62, "cartridge" should read --cartridges--.

COLUMN 5:

Line 43, "(Secondary" should read --(secondary--.

COLUMN 6:

Line 4, "Image" should read --image--.
Line 63, "TC." should read --IC.--

UNITED STATES PATENT AND TRADEMARK OFFICE
CERTIFICATE OF CORRECTION

PATENT NO. : 6,014,533

DATED : January 11, 2000

INVENTOR(S) : Takashi KAWANA

It is certified that error appears in the above-identified patent and that said Letters Patent is hereby corrected as shown below:

COLUMN 7:

Line 12, "he" should read --the--.
Line 43, "(206)." should read --(or 206).--.
Line 66, "it" should be deleted.

COLUMN 8:

Line 37, "and," should read --, and--.

COLUMN 9:

Line 4, "eight" should read --eighth--.
Line 27, "1.0" should read --1.0mm.--.
Line 32, "distance s" should read --distances--.
Line 33, "EEPROm" should read --EEPROM--.

COLUMN 10:

Line 50, "tour" should read --four--.
Line 62, "drum" should read --drum.--.

UNITED STATES PATENT AND TRADEMARK OFFICE
CERTIFICATE OF CORRECTION

PATENT NO. : 6,014,533
DATED : January 11, 2000
INVENTOR(S) : Takashi KAWANA

It is certified that error appears in the above-identified patent and that said Letters Patent is hereby corrected as shown below:

COLUMN 12:

Line 13, "device" should read --device,--.

COLUMN 13

Line 17, "comprising:" should read --according to Claim 4,--.
Lines 18-20, delete in their entirety.
Line 43, "6, or 7" should read --6 or 7,--.

COLUMN 14

Line 41, "electric" should read --electrical--.

Signed and Sealed this

Thirteenth Day of March, 2001

Attest:

NICHOLAS P. GODICI

*Attesting Officer*            *Acting Director of the United States Patent and Trademark Office*